(12) United States Patent
Choi

(10) Patent No.: US 8,373,223 B2
(45) Date of Patent: Feb. 12, 2013

(54) SEMICONDUCTOR DEVICE AND METHOD FOR FABRICATING THE SAME

(75) Inventor: Kang Sik Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 322 days.

(21) Appl. No.: 12/772,026

(22) Filed: Apr. 30, 2010

(65) Prior Publication Data

US 2010/0276739 A1      Nov. 4, 2010

Related U.S. Application Data

(62) Division of application No. 11/529,381, filed on Sep. 29, 2006, now Pat. No. 7,709,328.

(30) Foreign Application Priority Data

Apr. 14, 2006      (KR) .................. 10-2006-0034051

(51) Int. Cl.
    *H01L 29/76*      (2006.01)
(52) U.S. Cl. ................ 257/330; 257/E21.419
(58) Field of Classification Search .................. 257/285, 257/330, 287, 331, 510, E21.384, E21.419
See application file for complete search history.

(56) References Cited

U.S. PATENT DOCUMENTS

| | | | |
|---|---|---|---|
| 5,965,914 A | 10/1999 | Miyamoto | |
| 7,368,348 B2* | 5/2008 | Lee | ............... 438/259 |
| 2006/0125018 A1 | 6/2006 | Lee et al. | |
| 2007/0004128 A1 | 1/2007 | Jung | |

FOREIGN PATENT DOCUMENTS

| | | |
|---|---|---|
| KR | 2004-29582 | 4/2004 |
| KR | 2005-49671 | 5/2005 |

OTHER PUBLICATIONS

Yang et al., "5 nm-Gate Nanowire FinFET," *Symposium on VLSI Technology, Digest of Technical Papers*, pp. 196-197 (2004).
Korean Notice of Rejection for Korean Patent App. No. 10-2006-0034051 dated Apr. 23, 2007.

* cited by examiner

*Primary Examiner* — Quoc Hoang
(74) *Attorney, Agent, or Firm* — Kilpatrick Townsend & Stockton LLP

(57) ABSTRACT

The semiconductor device includes a device isolation structure formed in a semiconductor substrate to define an active region, a bridge type channel structure formed in the active region, and a coaxial type gate electrode surrounding the bridge type channel structure of a gate region. The bridge type channel structure is separated from the semiconductor substrate thereunder by a predetermined distance in a vertical direction.

20 Claims, 9 Drawing Sheets

( i )

( ii )

US 8,373,223 B2

SEMICONDUCTOR DEVICE AND METHOD FOR FABRICATING THE SAME

CROSS-REFERENCE TO RELATED APPLICATIONS

The present application is a divisional of U.S. patent application Ser. No. 11/529,381, filed on Sep. 29, 2006, which claims priority to Korean patent application number 10-2006-0034051, filed on Apr. 14, 2006, both of which are incorporated by reference in their entirety.

BACKGROUND OF THE INVENTION

The present invention relates to a memory device. More particularly, the present invention relates to a semiconductor device having a coaxial type gate structure and a method for fabricating the same.

When the channel length of a cell transistor is decreased, the ion concentration of the cell channel structure is generally increased in order to maintain threshold voltage of the cell transistor. Due to the increase in the ion concentration of the cell channel structure, an electric field in the source/drain regions of the cell transistor is enhanced to increase leakage current. This results in the degradation of the refresh characteristics of a DRAM structure. In addition, as the semiconductor device shrinks to smaller sizes, it is difficult to solve problems regarding the short channel effect ("SCE"). Therefore, new structures of the transistor such as a recess gate transistor and a fin channel transistor have been proposed to increase the channel length of the cell transistor.

However, these structures of the semiconductor device can not completely surround the channel structure of the transistor, which causes problems in gate controllability and the performance of the device. Accordingly, there is a need for a new structure of the transistor in order to improve the gate controllability and performance of the device.

SUMMARY OF THE INVENTION

Embodiments of the present invention are directed to a semiconductor device having a coaxial gate structure with the channel structure surrounded with a gate electrode. According to one embodiment, the coaxial gate structure is provided with a coaxial type channel structure.

In one embodiment of the present invention, a semiconductor device comprises a device isolation structure formed in a semiconductor substrate to define an active region; a bridge type channel structure formed in the active region; and a coaxial type gate electrode surrounding the bridge type channel structure of the gate region. The bridge type channel structure is separated from the semiconductor substrate under the bridge type channel structure by a predetermined distance in a vertical direction.

In one embodiment of the present invention, a semiconductor device comprises a device isolation structure formed in a semiconductor substrate to define a plurality of separated active regions and a fin type active region connecting the separated active regions; a bridge type channel structure formed in the fin type channel structure; and a coaxial type gate electrode surrounding the bridge type channel structure of a gate region. The bridge type channel structure is separated from the semiconductor substrate thereunder by a predetermined distance.

According to another embodiment of the present invention, a method for fabricating a semiconductor device includes: forming a device isolation structure over a semiconductor substrate having a pad insulating film to define an active region; etching a predetermined region of the device isolation structure by using a recess mask to form a recess exposing sidewalls of the semiconductor substrate under the active region; etching the exposed sidewalls of the semiconductor substrate at a lower part of the recess to form an under-cut space separating an upper semiconductor substrate from a lower semiconductor substrate under the active region, wherein a bridge type channel structure is formed at the upper semiconductor substrate; removing the pad insulating film to expose the semiconductor substrate including the bridge type channel structure; forming a gate insulating film over the exposed semiconductor substrate including the bridge type channel structure; and forming a coaxial type gate electrode over the gate insulating film of a gate region to fill the recess and the under-cut space, wherein the coaxial type gate electrode surrounds the bridge type channel structure.

DESCRIPTION OF SPECIFIC EMBODIMENTS

The present invention relates to a semiconductor device and a method for fabricating the same wherein a coaxial type gate electrode surrounding a bridge type channel structure, which is separated from a semiconductor substrate under the bridge type channel structure, is formed, thereby improving gate controllability. Accordingly, a semiconductor device with a low voltage and high speed operation can be realized.

Figure 1:
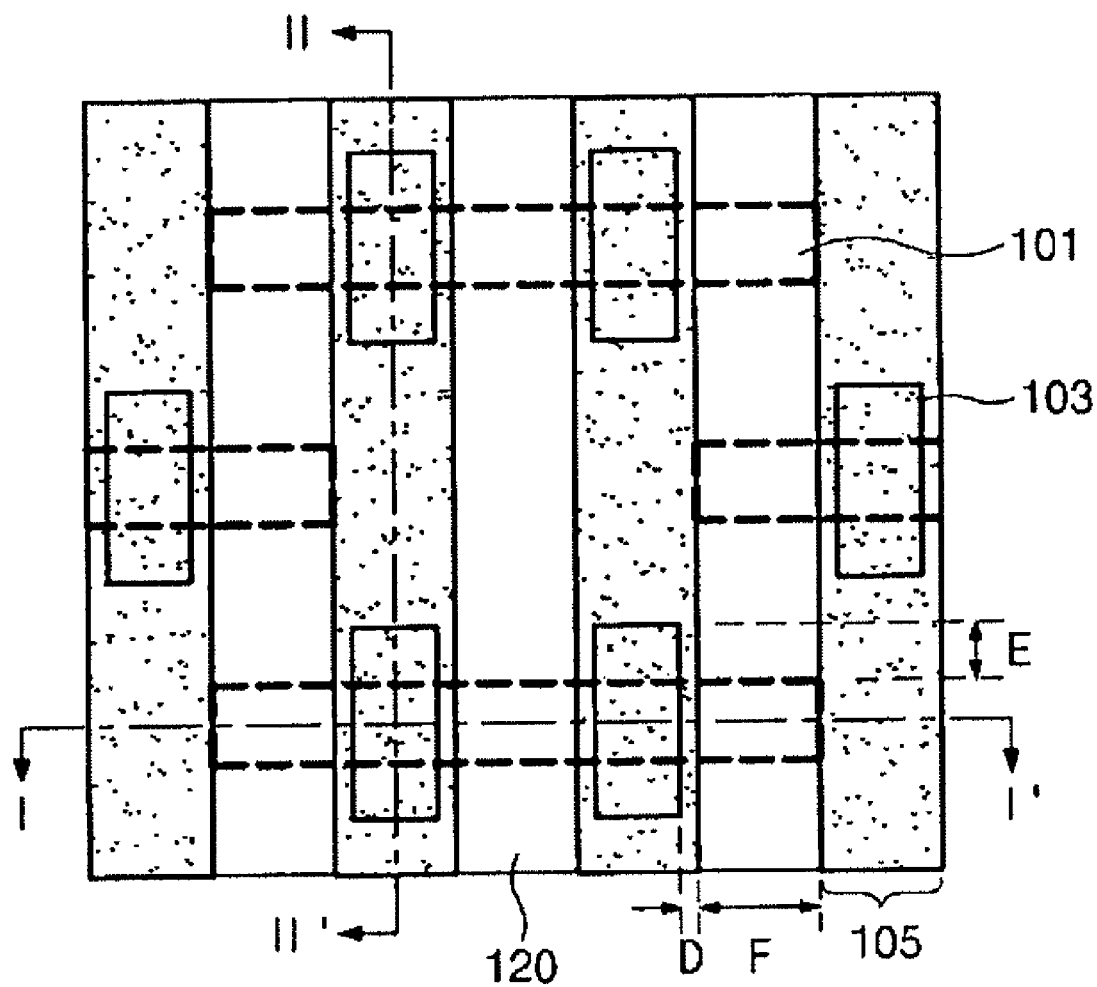
FIG. 1 is a simplified layout of a semiconductor device according to one embodiment of the present invention.

FIG. 1 is a simplified layout of a semiconductor device according to one embodiment of the present invention. The semiconductor device includes an active region 101 defined by a device isolation structure 120, a recess region 103, and a gate region 105. In one embodiment of the present invention, the recess region 103 is islanded. The width of the recess region 103 is less than that of the gate region 105 by 2D in a longitudinal direction of the active region 101, and the length of the recess region 103 is greater than the width of the active region 101 by 2E in a longitudinal direction of the gate region 105. Distance F is the distance between the neighboring gate regions 105.

Figure 2:
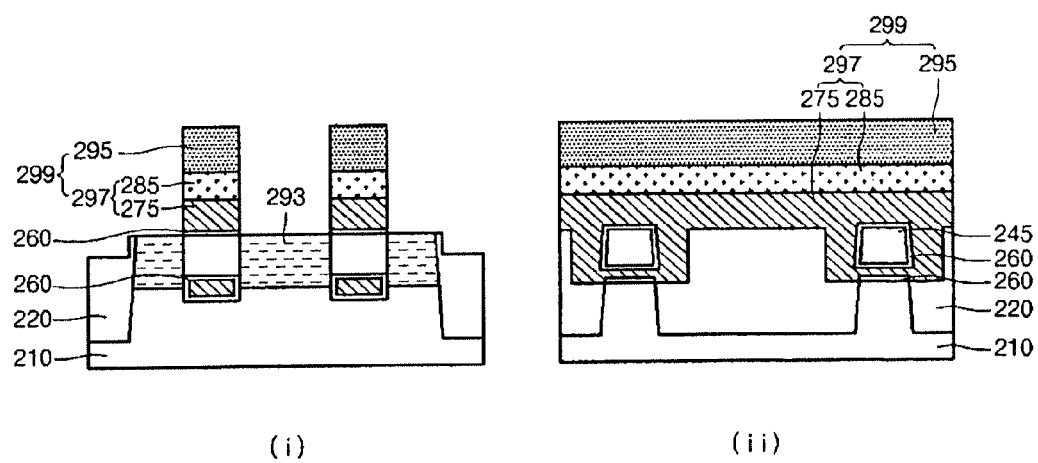
FIG. 2 is a simplified cross-sectional view of a semiconductor device according to one embodiment of the present invention.

FIG. 2 is a simplified cross-sectional view illustrating a semiconductor device according to a first embodiment of the present invention, wherein FIG. 2(*i*) is a cross-sectional view taken along a latitudinal direction in accordance with the line I-I' of FIG. 1 and FIG. 2(*ii*) is a cross-sectional view taken along a longitudinal direction in accordance with the line II-II' of FIG. 1. A device isolation structure 220 is formed in a semiconductor substrate 210 to define an active region 101 shown in FIG. 1. A bridge type channel structure 245 is formed in the active region to separate the bridge type channel structure 245 from the semiconductor substrate under the active region by a predetermined distance. A gate insulating film 260 is formed over the exposed semiconductor substrate 210. A gate structure 299 includes a stacked structure of a gate hard mask layer 295 and a coaxial type gate electrode 297 surrounding the bridge type channel structure 245. Further, source/drain regions 293 are formed in the semiconductor substrate 210 at sides of the coaxial type gate electrode 297. In one embodiment of the present invention, the thickness of the bridge type channel structure 245 from the top surface of the semiconductor substrate 210 ranges from about 150 Å to 3,000 Å. The predetermined distance between the bridge type channel structure 245 and the separated semiconductor substrate 210 ranges from about 500 Å to 2,500 Å. In addition, the depth of the source/drain regions 293 ranges from the top surface of the semiconductor substrate 210 to a level between the bridge type channel structure 245 and the separated semiconductor substrate 210 under the bridge type channel structure 245.

Figure 3A:
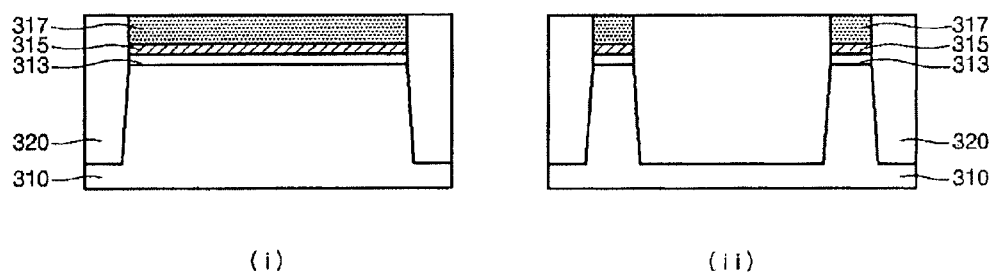
FIGS. 3a through 3g are simplified cross-sectional views illustrating a method for fabricating a semiconductor device according to one embodiment of the present invention.

FIGS. 3a through 3g are simplified cross-sectional views illustrating a method for fabricating a semiconductor device according to the first embodiment of the present invention, wherein FIGS. 3a(i) through 3g(i) are cross-sectional views taken along a latitudinal direction in accordance with the line I-I' of FIG. 1 and FIGS. 3a(ii) through 3g(ii) are cross-sectional views taken along a longitudinal direction in accordance with the line II-II' of FIG. 1. A pad oxide film 313, a pad polysilicon layer 315, and a pad nitride film 317 are formed over a semiconductor substrate 310. The pad nitride film 317, the pad polysilicon layer 315, the pad oxide film 313, and the semiconductor substrate 310 are etched using a device isolation mask as an etching mask to form a trench (not shown) defining an active region. A device isolation structure 320 is formed to fill the trench.

Figure 3B:
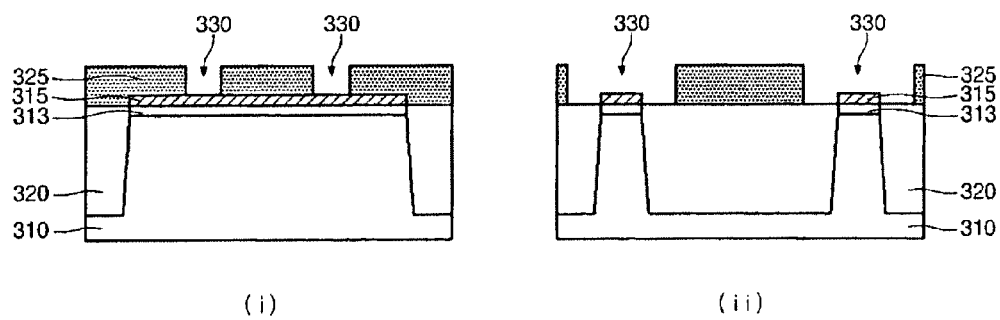

Referring to FIG. 3b, the pad nitride film 317 is removed to lower the height of the device isolation structure 320. A photoresist film (not shown) is formed over the device isolation structure 320 and the pad polysilicon layer 315, then exposed and developed to form a photoresist film pattern 325 defining the recess region 103 shown in FIG. 1. In one embodiment of the present invention, the photoresist film pattern 325 is formed as an island type window 330, which partially exposes the active region 101 shown in FIG. 1 and the device isolation structure 320 next to the active region 101. In addition, the width of the island type window 330 is less than that of the gate region 105 shown in FIG. 1 by 2D in a longitudinal direction of the active region 101 shown in FIG. 1, and the length of the island window 330 is greater than the width of the active region 101 by 2E in the longitudinal direction of the gate region 105 (where $0 \leq D \leq (\frac{1}{3})F, 0 \leq E \leq F$, and distance F is the distance between the neighboring gate regions 105 shown in FIG. 1).

Figure 3C:
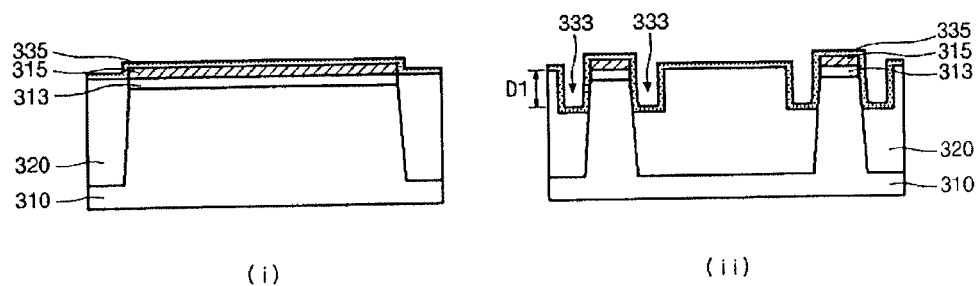

Referring to FIG. 3c, the device isolation structure 320 exposed by the island type window 330 is etched to form a recess 333 exposing sidewalls of the semiconductor substrate 310 under the active region 101 shown in FIG. 1. The photoresist film pattern 325 is removed. An etch barrier layer 335 is formed over an entire surface of the resultant (i.e. the etch barrier layer 335 is formed over the device isolation structure 320 and the pad polysilicon layer 315 including the recess 333). In one embodiment of the present invention, the device isolation structure 320 is etched up to a depth D1, which is equal to the substantial thickness of the bridge type channel structure to be formed in a subsequent process. In addition, the thickness of the etched device isolation structure 320 from the top surface of the semiconductor substrate 310 ranges from about 150 Å to 3,000 Å. In another embodiment, the etch barrier layer 335 is a nitride film with a conformal characteristics.

Figure 3D:
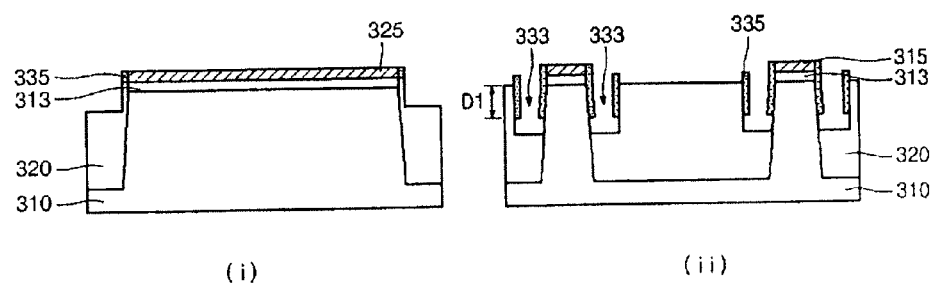

Referring to FIG. 3d, the etch barrier layer 335 is etched by an etch-back method to expose the device isolation structure 320 under the recess 333. The exposed device isolation structure 320 is further etched to expose sidewalls of the semiconductor substrate 310 under the recess 333. In one embodiment of the present invention, the etched thickness for the device isolation structure 320 can be adjusted according to a thickness related to the operation of a cell transistor in the range of about 500 Å to 2,500 Å. In addition, the etching process for the device isolation structure 320 is performed by one selected from the group consisting of a dry etching method, a wet etching method or combination thereof.

Figure 3E:
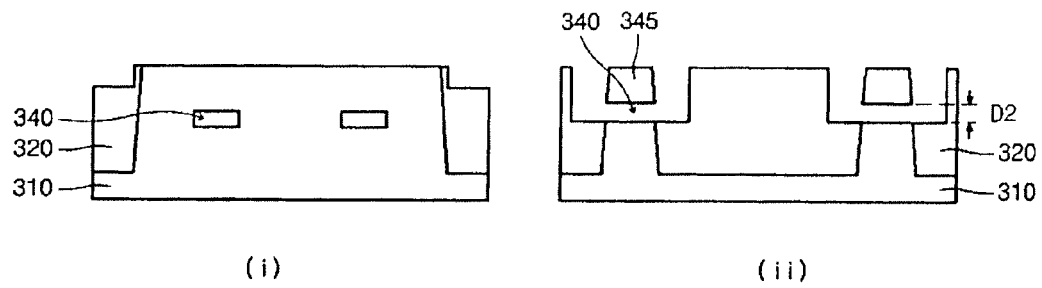

Referring to FIG. 3e, the exposed semiconductor substrate 310 under the recess 333 is etched by an isotropic etching method to form an under-cut space 340 separating an upper semiconductor substrate 310 from a lower semiconductor substrate 310. Here, the bridge type channel structure 345 is formed at the upper semiconductor substrate 310 over the under-cut space 340. The etch barrier layer 335 shown in FIG. 3d is removed to expose the semiconductor substrate 310 including the bridge type channel structure 345. In one embodiment of the present invention, the pad polysilicon layer 315 is simultaneously removed during the etching process for the semiconductor substrate 310. In addition, the pad oxide film 313 is removed during the removal process for the etch barrier layer 335. In another embodiment, the thickness D2 of the etched semiconductor substrate 310 for forming the bridge type channel structure 345 ranges from about 500 Å to 2,500 Å. In other embodiment, the surface of the exposed semiconductor substrate 310 is annealed at an atmosphere of $H_2$ or etched by a radical etching method to round the edges of the exposed bridge type channel structure 345, which results in reducing increasing electric field.

Figure 4:
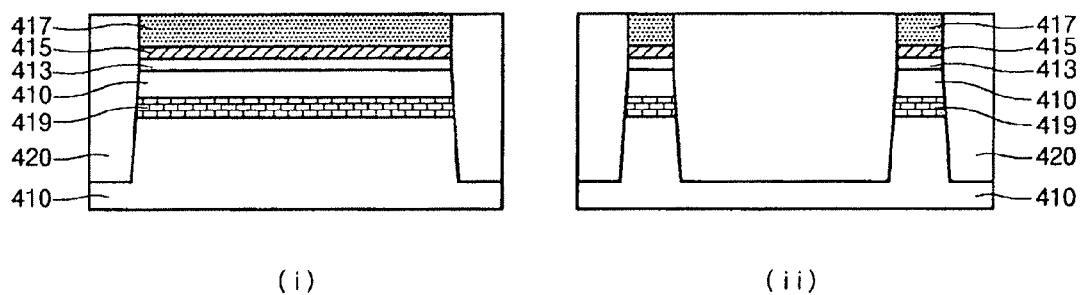
FIG. 4 is a simplified cross-sectional view of a semiconductor device according to another embodiment of the present invention.

FIG. 4 illustrates a semiconductor device according to another embodiment of the present invention in order to easily form the bridge type channel structure 345 shown in FIG. 3e. A SiGe layer 419 is formed between semiconductor substrates 410. A pad oxide film 413, a pad polysilicon layer 415, and a pad nitride film 417 are formed over a semiconductor substrate 410. The pad nitride film 417, the pad polysilicon layer 415, the pad oxide film 413, and the semiconductor substrate 410 are etched using a device isolation mask as an etching mask to form a trench (not shown) defining an active region 101 shown in FIG. 1. A device isolation structure 420 is formed to fill the trench. During a process for forming a recess 333 shown in FIG. 3d, sidewalls of the SiGe layer 419 are exposed. The exposed SiGe layer 419 is removed by a wet etching method to form an under-cut space 340 shown in FIG. 3e.

Figure 3F:
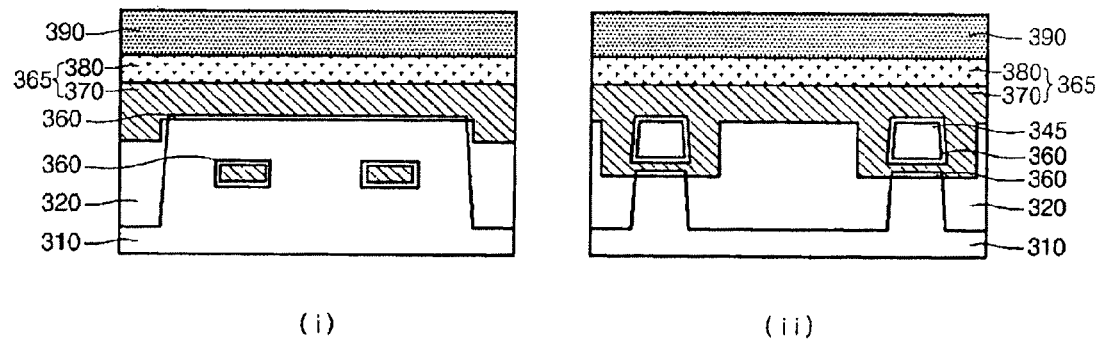

Referring to FIG. 3f, a gate insulating film 360 is formed over the exposed semiconductor substrate 310 including the semiconductor substrate 310 exposed at the under-cut space 340 shown in FIG. 3e. A gate conductive layer 365 is formed over an entire surface of the resultant to fill the under-cut space 340 and the bridge type channel structure 345. A gate hard mask layer 390 is formed over the gate conductive layer 365. In one embodiment of the present invention, since the gate conductive layer 365 has an excellent step coverage characteristics, the gate conductive layer 365 completely fills up the recess 333 and the under-cut space 340. The gate conductive layer 365 surrounds the bridge type channel structure 345. In another embodiment, the gate conductive layer 365 comprises a stacked structure of a lower gate conductive layer 370 and an upper gate conductive layer 380.

Figure 3G:
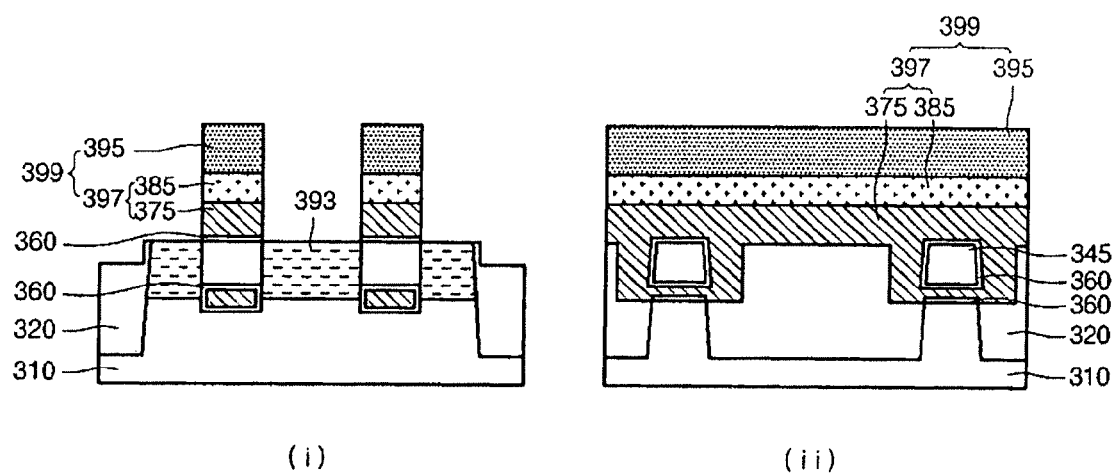

Referring to FIG. 3g, the gate hard mask layer 390 and the gate conductive layer 365 shown in FIG. 3f are patterned using a gate mask (not shown) to form the gate structure 399 including a stacked structure of a gate hard mask layer pattern 395 and a coaxial type gate electrode 397 surrounding the bridge type channel structure 345. Ion implantation process is performed on the semiconductor substrate 310 at sides of the gate structure 399 to form source/drain regions 393.

Figure 5:
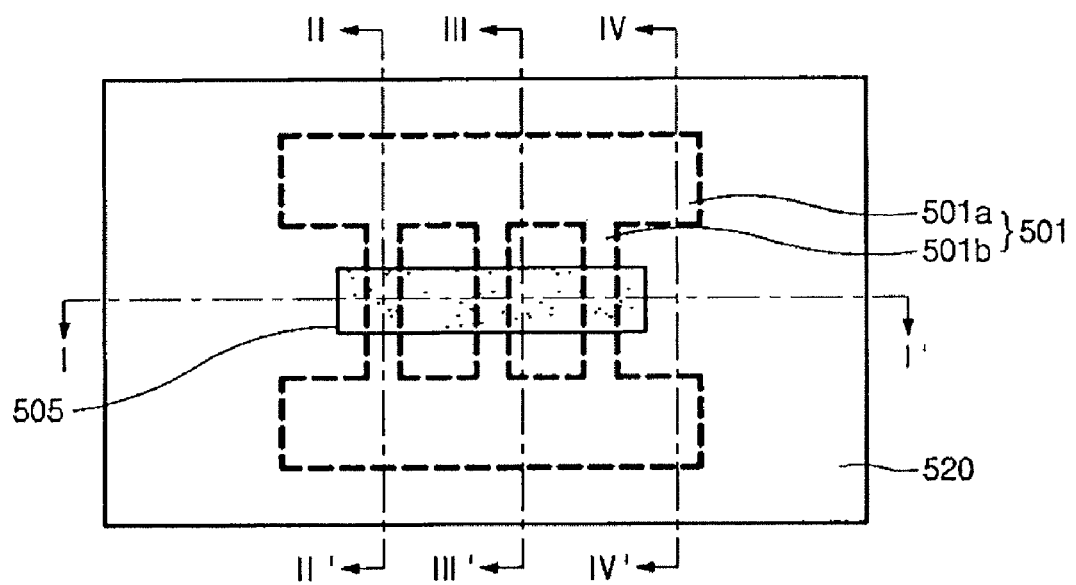
FIG. 5 is a simplified layout of a semiconductor device according to another embodiment of the present invention.

FIG. 5 is a simplified layout of a semiconductor device according to a second embodiment of the present invention. The semiconductor device includes an active region 501 defined by a device isolation structure 520 and a gate region 505. The active region 501 includes a plurality of separated active regions 501a where source/drain regions are to be formed in a subsequent process and at least one fin type active region 501b which connects the separated active regions 501a. The separated active region 501a is protruded over the device isolation structure 520. A bridge type channel structure, which is to be separated from the semiconductor substrate under the bridge type channel structure in a subsequent process, is formed at the fin type channel structure 501b. The gate region 505 includes a portion of the fin type active region 501b between the separated active regions 501a and the device isolation structure 520 adjacent to the fin type active region 501b. In one embodiment of the present invention, the separated active region 501a is islanded. The width of the gate region 505 is at most equal to the distance between the separated active regions 501a.

Figure 6:
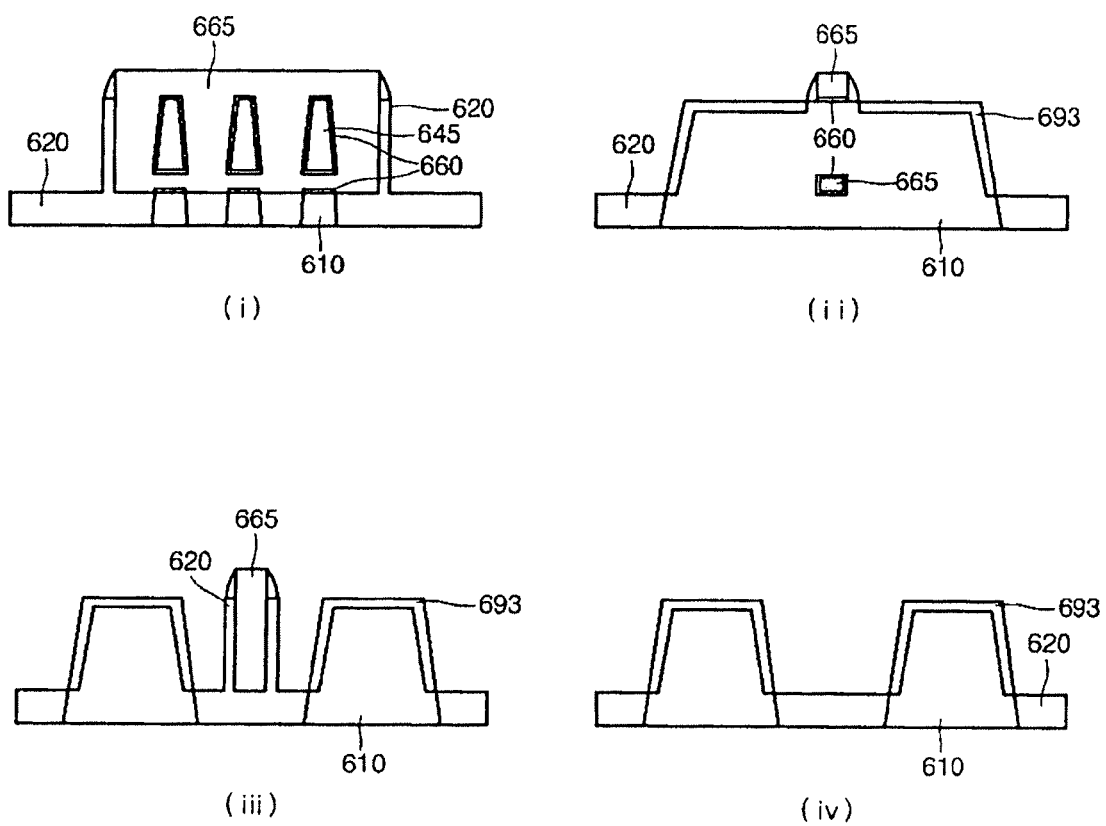
FIG. 6 is a simplified cross-sectional view of a semiconductor device according to another embodiment of the present invention.

FIG. 6 is a simplified cross-sectional view of a semiconductor device according to the second embodiment of the present invention, wherein FIG. 6(i) is a cross-sectional view taken along a latitudinal direction in accordance with the line I-I' of FIG. 5 and FIGS. 6(ii) through 6(iv) are respectively cross-sectional views taken along a longitudinal direction in accordance with the lines II-III, III-III', and IV-IV' of FIG. 5. The device isolation structure 620 is formed in a semiconductor substrate 610 to define an active region 501 shown in FIG. 5. The active region 501a is disposed at the plurality of the separated semiconductor substrate 610 protruded over the device isolation structure 620. A bridge type channel structure 645 is formed at the fin type active region 501b shown in FIG. 5 which connects the separated active regions 501a, and separated from the semiconductor substrate 610 under the bridge type channel structure 645 by a predetermined distance. Further, source/drain regions 693 are formed in the plurality of the separated semiconductor substrate 610 and the semiconductor substrate 610 at both sides of the bridge type channel structure 645. In one embodiment of the present invention, a coaxial type gate structure 695 is disposed at the gate region 505 shown in FIG. 5 between the separated active regions 501a. The coaxial type gate structure 695 includes the bridge type channel structure 645, the gate insulating film 660 formed over the bridge type channel structure 645, and a coaxial type gate electrode 665 surrounding the bridge type channel structure 645 and the gate insulating film 660. The number of the bridge type channel structure 645 is at least one. The predetermined distance between the bridge type channel structure 645 and the separated semiconductor substrate 610 under the bridge type channel structure 645 ranges from about 500 Å to 2,500 Å. In addition, a thickness of the bridge type channel structure 645 from the top surface of the semiconductor substrate 610 ranges from about 150 Å to 3,000 Å.

As described above, the semiconductor device and method for fabricating the same in accordance with an embodiment of the present invention provides a coaxial type gate structure in which a bridge type channel structure separated from a semiconductor substrate thereunder is surrounded with a gate electrode, thereby improving gate controllability and operative capability. Accordingly, a semiconductor device with a low voltage and high speed operation can be realized.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a device isolation structure formed in a semiconductor substrate to define an active region;
   a bridge type channel structure formed in the active region, wherein the bridge type channel structure is separated from the semiconductor substrate thereunder by a predetermined distance in a vertical direction;
   a coaxial type gate electrode surrounding the bridge type channel structure of a gate region of a plurality of neighboring gate regions; and
   a recess region including a width that is less than that of the gate region by 2D in a longitudinal direction of the active region, where $0<D<(\frac{1}{3})F$, where F is the distance between neighboring gate regions.

2. The semiconductor device according to claim 1, wherein a thickness of the bridge type channel structure from the top surface of the semiconductor substrate ranges from about 150 Å to about 3,000 Å in the vertical direction.

3. The semiconductor device according to claim 1, wherein the predetermined distance between the bridge type channel structure and the semiconductor substrate thereunder ranges from about 500 Å to about 2,500 Å.

4. The semiconductor device according to claim 1, further comprising source/drain regions formed in the semiconductor substrate at both sides of the coaxial type gate electrode.

5. The semiconductor device according to claim 4, wherein the source/drain regions are formed from the top surface of the semiconductor substrate to a predetermined level between the bridge type channel structure and the separated semiconductor substrate thereunder.

6. The semiconductor device according to claim 1, wherein the recess region has a length that is greater than a width of the active region by 2E in a longitudinal direction of the gate region, where $0<E<F$.

7. The semiconductor device according to claim 1, further comprising a gate structure including a stacked structure of a gate hard mask layer and the coaxial type gate electrode surrounding the bridge type channel structure.

8. The semiconductor device according to claim 1, further comprising source/drain regions formed in the semiconductor substrate at sides of the coaxial type gate electrode.

9. The semiconductor device according to claim 8, wherein a depth of the source/drain regions ranges from the top surface of the semiconductor substrate to a level between the bridge type channel structure and the separated semiconductor substrate under the bridge type channel structure.

10. The semiconductor device according to claim 1, wherein the semiconductor device is implemented in a dynamic random access memory (DRAM) device.

11. The semiconductor device according to claim 1, wherein the semiconductor device is implemented in a non volatile memory device.

12. A semiconductor device comprising:
a device isolation structure formed in a semiconductor substrate to define a plurality of separated active regions and a fin type active region connecting the separated active regions;
a bridge type channel structure formed in the fin type active region, wherein the bridge type channel structure is separated from the semiconductor substrate thereunder by a predetermined distance; and
a coaxial type gate electrode surrounding the bridge type channel structure of a gate region,
wherein the separated active regions and the fin type active region are formed to be protruded over the device isolation structure.

13. The semiconductor device according to claim 12, wherein a thickness of the bridge type channel structure from the top surface of the semiconductor substrate ranges from about 150 Å to about 3,000 Å in the vertical direction.

14. The semiconductor device according to claim 12, wherein the predetermined distance between the bridge type channel structure and the separated semiconductor substrate thereunder ranges from about 500 Å to about 2,500 Å.

15. The semiconductor device according to claim 12, further comprising source/drain regions formed at the plurality of separated active regions, the plurality of separated active regions protruded over the device isolation structure.

16. The semiconductor device according to claim 12, wherein the gate region includes a portion of the fin type active region between the separated active regions and the device isolation structure adjacent to the fin type active region.

17. The semiconductor device according to claim 12, wherein at least one of the separated active regions is islanded.

18. The semiconductor device according to claim 12, wherein the width of the gate region is at most equal to the distance between the separated active region.

19. The semiconductor device according to claim 12, wherein the semiconductor device is implemented in a dynamic random access memory (DRAM) device.

20. The semiconductor device according to claim 12, wherein the semiconductor device is implemented in a non volatile memory device.

* * * * *